(12) United States Patent
Lee et al.

(10) Patent No.: US 11,985,847 B2
(45) Date of Patent: May 14, 2024

(54) CIRCULARLY POLARIZING PLATE

(71) Applicant: LG CHEM, LTD., Seoul (KR)

(72) Inventors: Yeon Keun Lee, Daejeon (KR); Hyun Hee Son, Daejeon (KR); Mun Kyu Joo, Daejeon (KR); Deok Hwan Kim, Daejeon (KR); Dong Choon Kim, Daejeon (KR)

(73) Assignee: LG CHEM, LTD., Seoul (KR)

( * ) Notice: Subject to any disclaimer, the term of this patent is extended or adjusted under 35 U.S.C. 154(b) by 590 days.

(21) Appl. No.: 17/273,404

(22) PCT Filed: Nov. 4, 2019

(86) PCT No.: PCT/KR2019/014806
§ 371 (c)(1),
(2) Date: Mar. 4, 2021

(87) PCT Pub. No.: WO2020/091552
PCT Pub. Date: May 7, 2020

(65) Prior Publication Data
US 2021/0336230 A1 Oct. 28, 2021

(30) Foreign Application Priority Data
Nov. 2, 2018 (KR) .......... 10-2018-0133585

(51) Int. Cl.
*G02B 1/11* (2015.01)
*G02B 5/30* (2006.01)
*H10K 50/86* (2023.01)

(52) U.S. Cl.
CPC .............. *H10K 50/86* (2023.02); *G02B 1/11* (2013.01); *G02B 5/3016* (2013.01); *G02B 5/3025* (2013.01); *G02B 5/3083* (2013.01)

(58) Field of Classification Search
CPC .. G02B 1/11; G02B 1/111; G02B 1/04; G02B 5/3016; G02B 5/3025; G02B 5/3083; G02B 5/3033; G02B 5/20; H10K 50/86; H10K 59/8971
USPC .......................................... 359/352
See application file for complete search history.

(56) References Cited

U.S. PATENT DOCUMENTS

| 6,800,378 | B2 | 10/2004 | Hawa et al. |
| 9,201,183 | B2 | 12/2015 | Yoon et al. |
| 9,259,906 | B2 | 2/2016 | Obata |
| 9,459,389 | B2 | 10/2016 | Shimizu et al. |
| 10,209,416 | B2 | 2/2019 | Jeon et al. |

(Continued)

FOREIGN PATENT DOCUMENTS

| CN | 105824069 | 8/2016 |
| EP | 3579029 A1 | 12/2019 |

(Continued)

OTHER PUBLICATIONS

International Search Report and the Written Opinion of PCT/KR2019/014806, mailed Feb. 11, 2020.

*Primary Examiner* — Stephone B Allen
*Assistant Examiner* — Jyotsna V Dabbi
(74) *Attorney, Agent, or Firm* — BRYAN CAVE LEIGHTON PAISNER LLP

(57) ABSTRACT

A circularly polarizing plate capable of improving the tone of reflective color sense by using a retardation film having flat dispersion characteristics; and an OLED device comprising the circularly polarizing plate.

14 Claims, 10 Drawing Sheets

(56) References Cited

U.S. PATENT DOCUMENTS

| | | |
|---|---|---|
| 10,520,656 B2 | 12/2019 | Murashige et al. |
| 2018/0017723 A1 | 1/2018 | Yu et al. |
| 2019/0072701 A1 | 3/2019 | Murashige et al. |

FOREIGN PATENT DOCUMENTS

| | | | |
|---|---|---|---|
| JP | H02-245702 | 10/1990 | |
| JP | H08-321381 | 12/1996 | |
| JP | 2002-022947 | 1/2002 | |
| JP | 2005-301245 | 10/2005 | |
| JP | 2006-503332 | 1/2006 | |
| JP | 2007-052345 | 3/2007 | |
| JP | 2012-179878 | 9/2012 | |
| JP | 2012194502 A * | 10/2012 | ............. B32B 27/18 |
| JP | 2014-092611 | 5/2014 | |
| JP | 2017-027734 | 2/2017 | |
| JP | 2017-165941 | 9/2017 | |
| JP | 2018-124431 | 8/2018 | |
| KR | 10-2012-0116887 | 10/2012 | |
| KR | 10-2013-0017074 | 2/2013 | |
| KR | 10-2015-0027139 | 3/2015 | |
| KR | 10-2016-0091226 | 8/2016 | |
| KR | 10-2017-0058894 | 5/2017 | |
| KR | 10-2017-0085511 | 7/2017 | |
| KR | 10-2018-0016591 | 2/2018 | |
| KR | 10-2018-0035093 | 4/2018 | |
| KR | 10-2018-0069762 | 6/2018 | |
| KR | 10-2018-0089429 | 8/2018 | |
| KR | 10-2018-0098240 | 9/2018 | |
| TW | 201802502 | 1/2018 | |
| WO | 2017-131201 | 8/2017 | |
| WO | 2018-110503 | 6/2018 | |
| WO | 2018-143167 | 8/2018 | |

\* cited by examiner

[Figure 1]
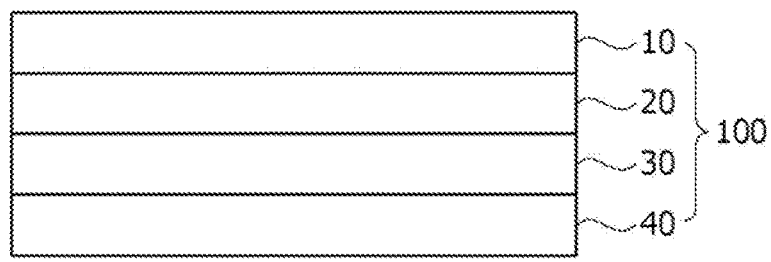
[Figure 2]
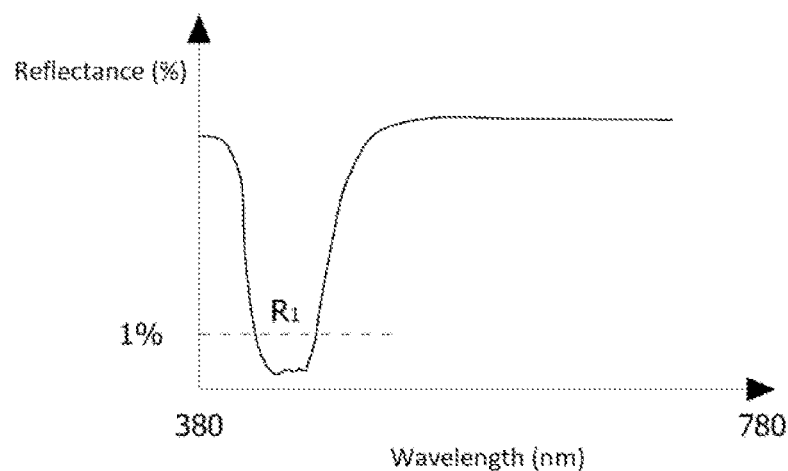
(a)
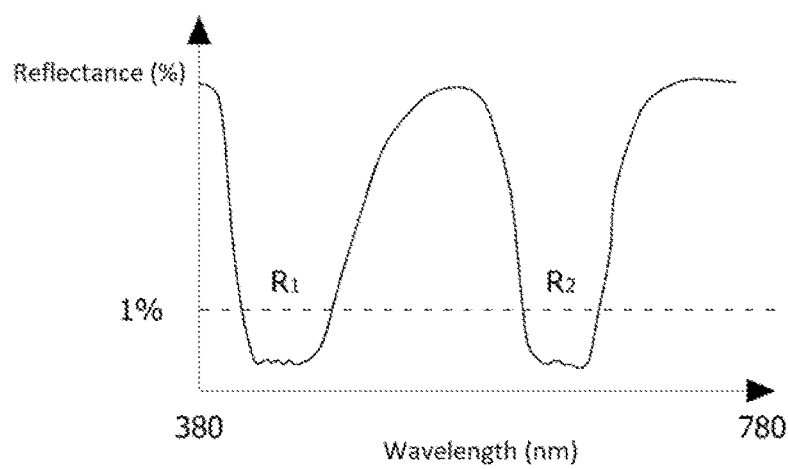
(b)

[Figure 3]
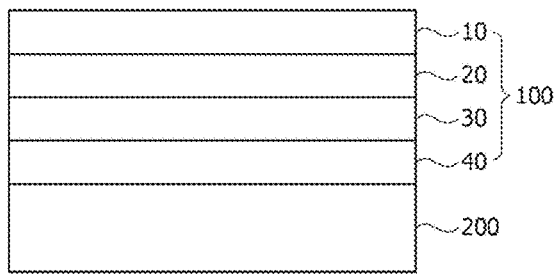
[Figure 4]
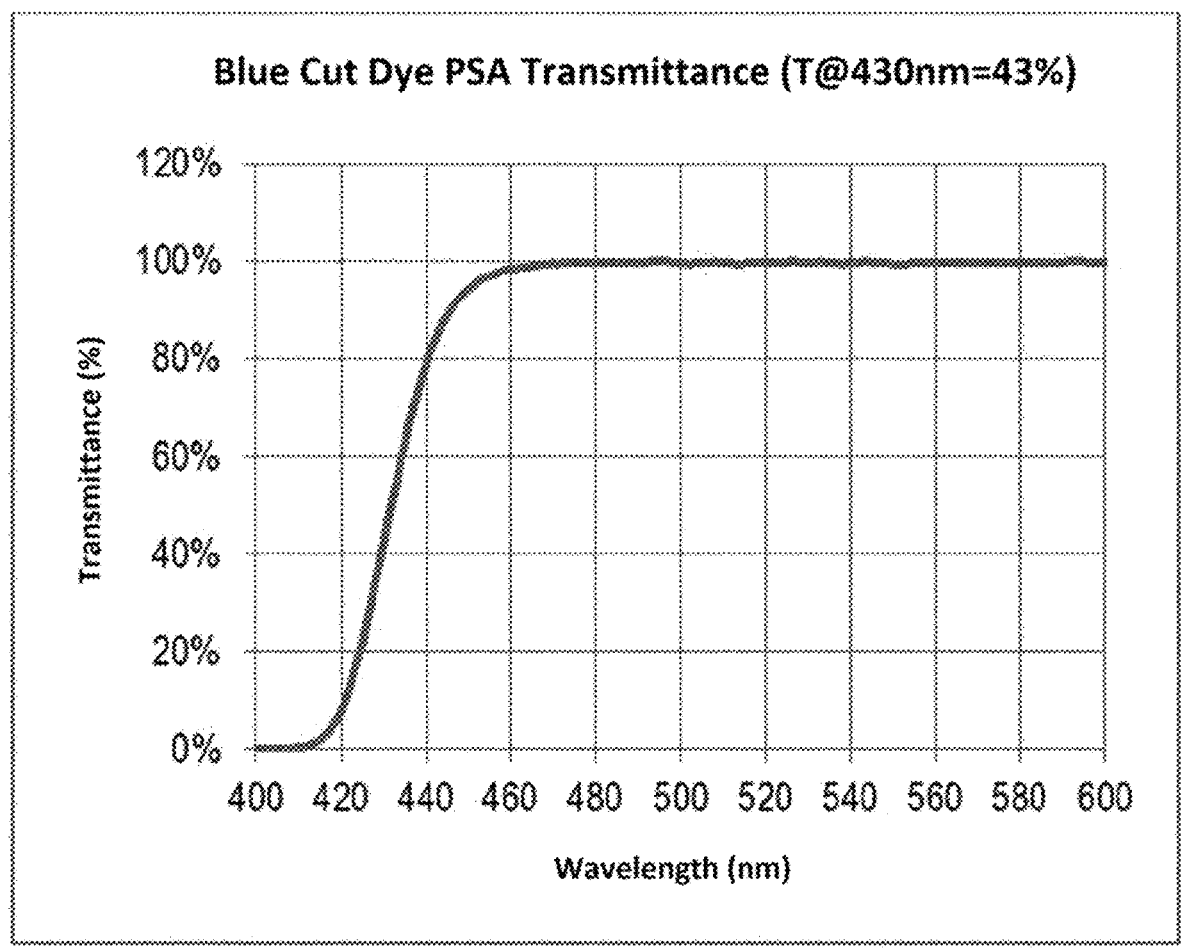

[Figure 5]
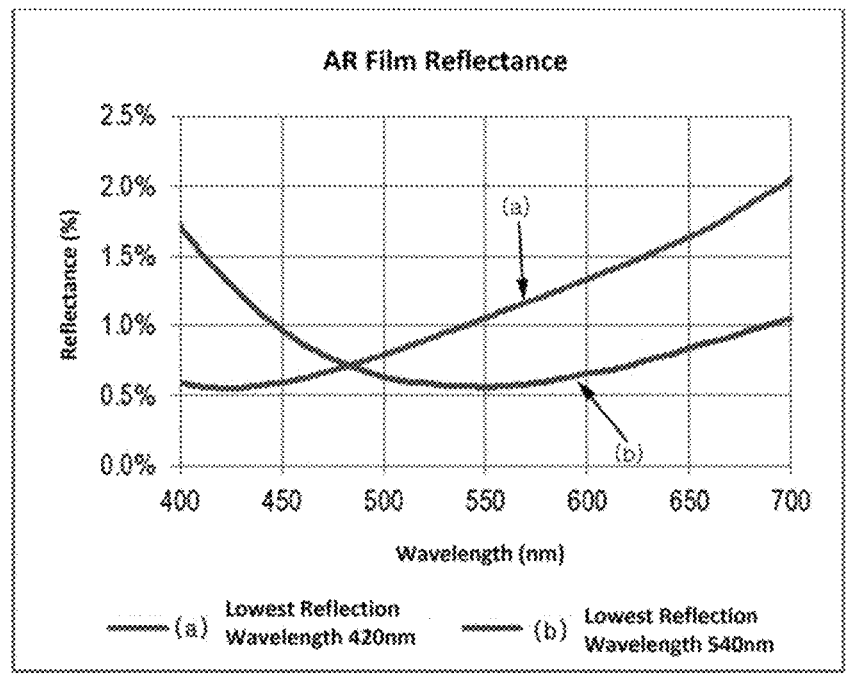
[Figure 6]
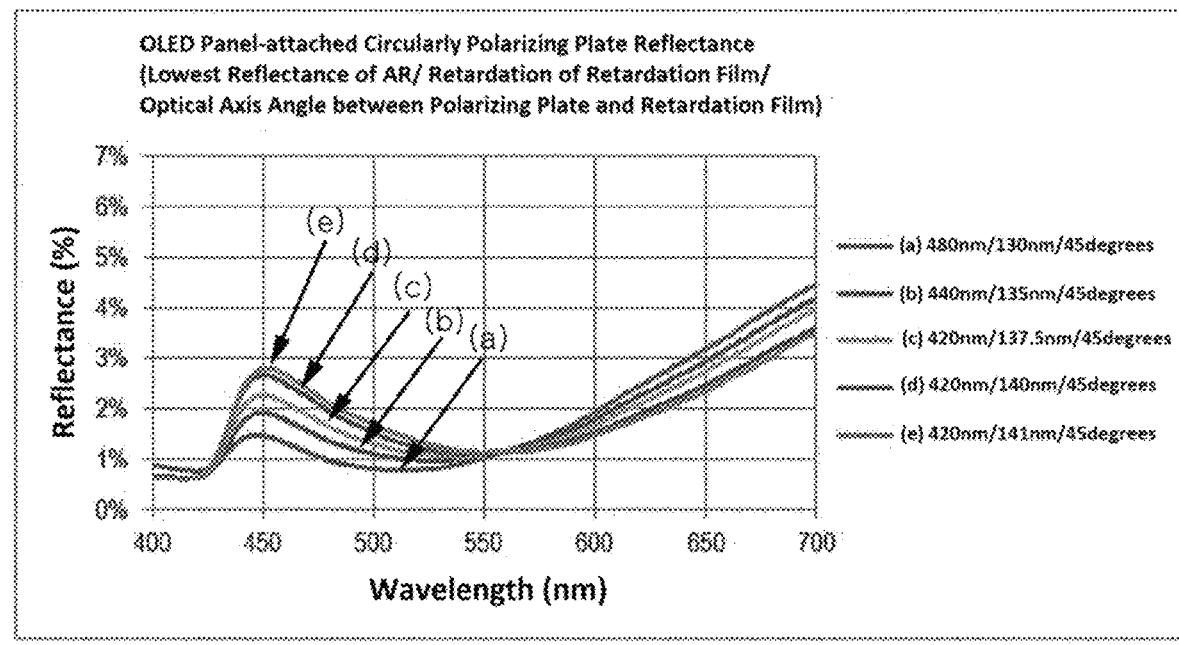

[Figure 7]
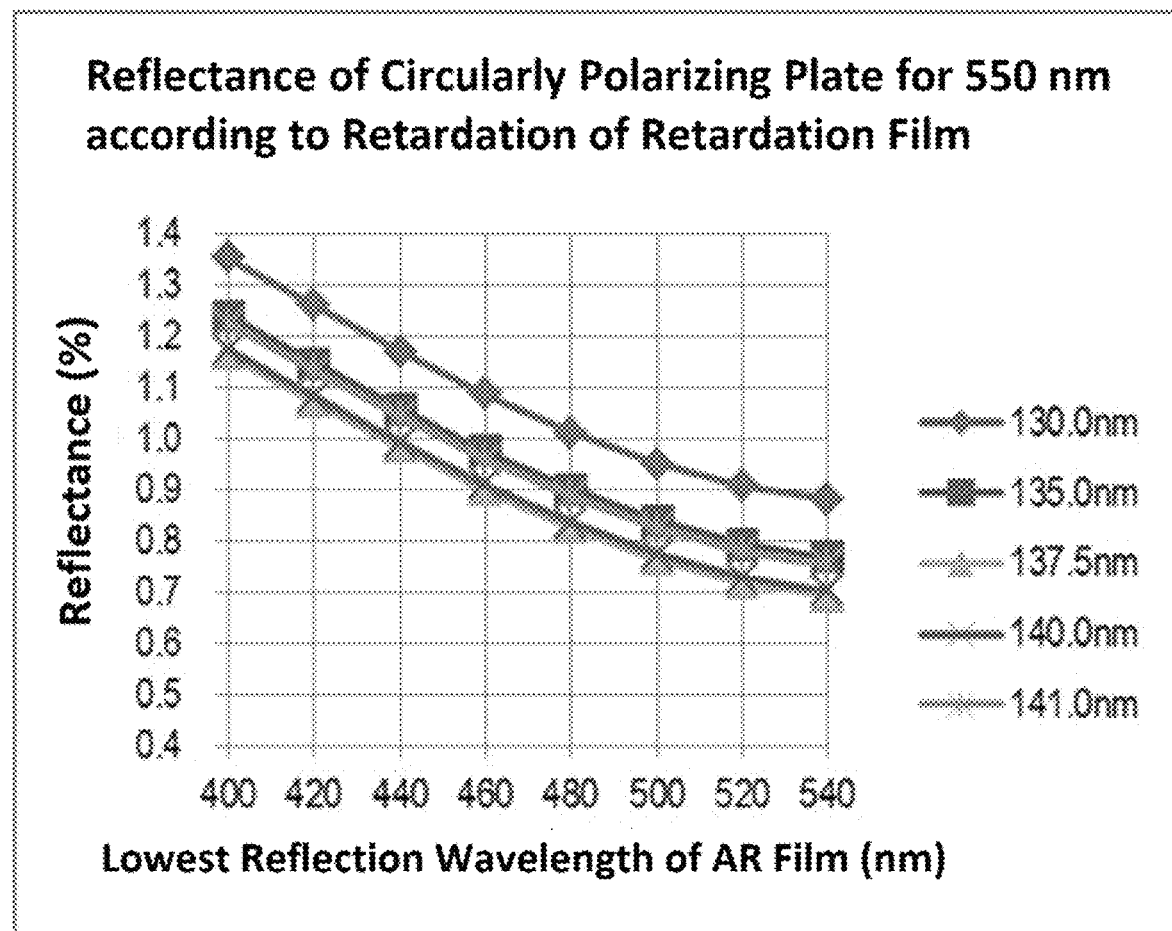

[Figure 8]
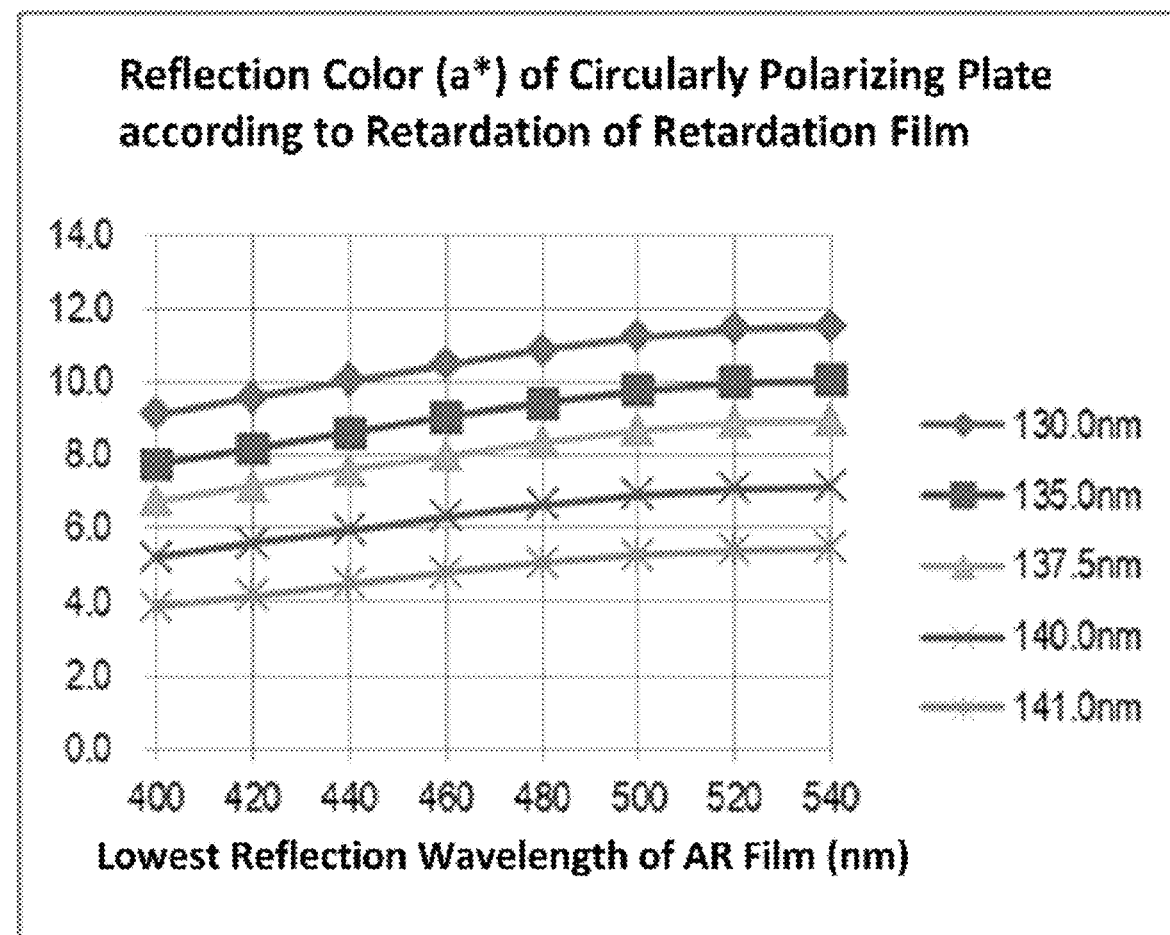

[Figure 9]
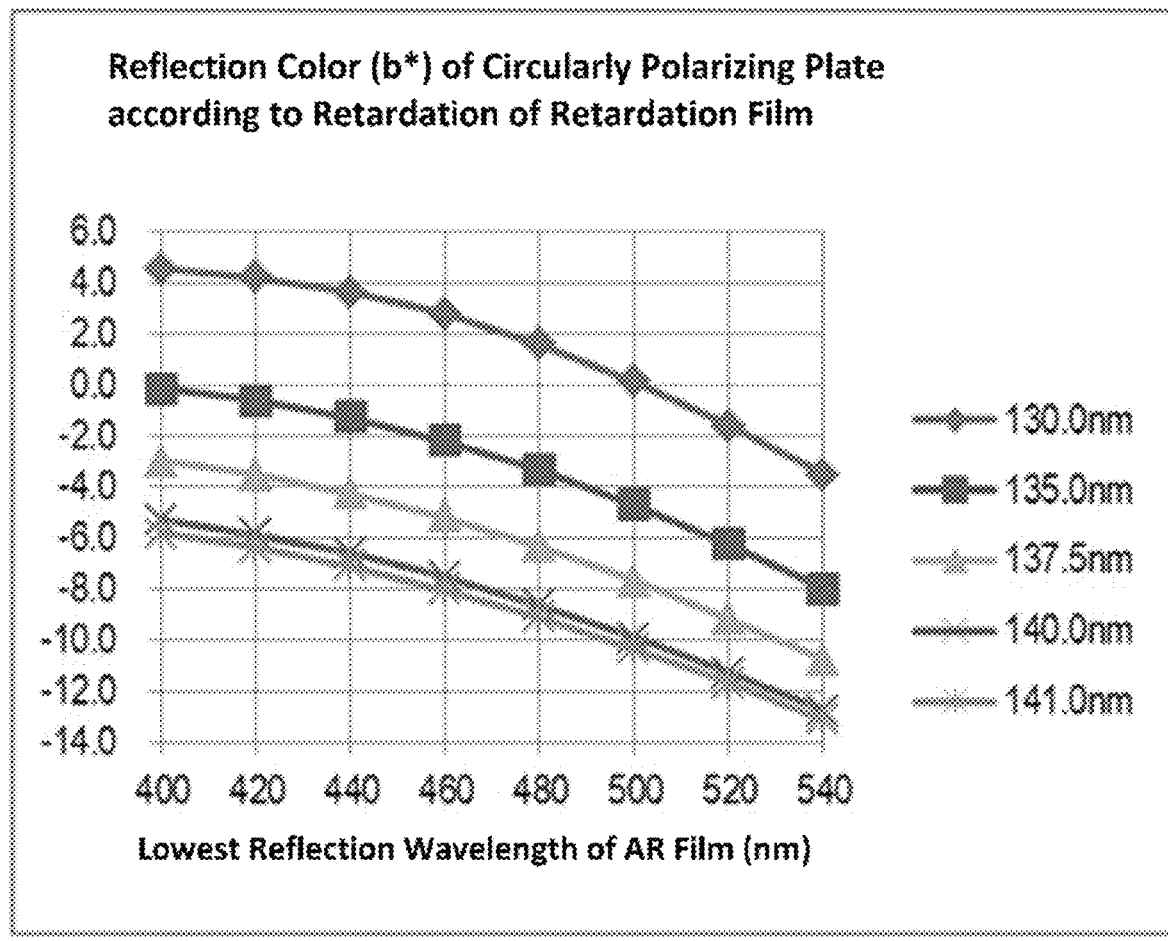

[Figure 10]
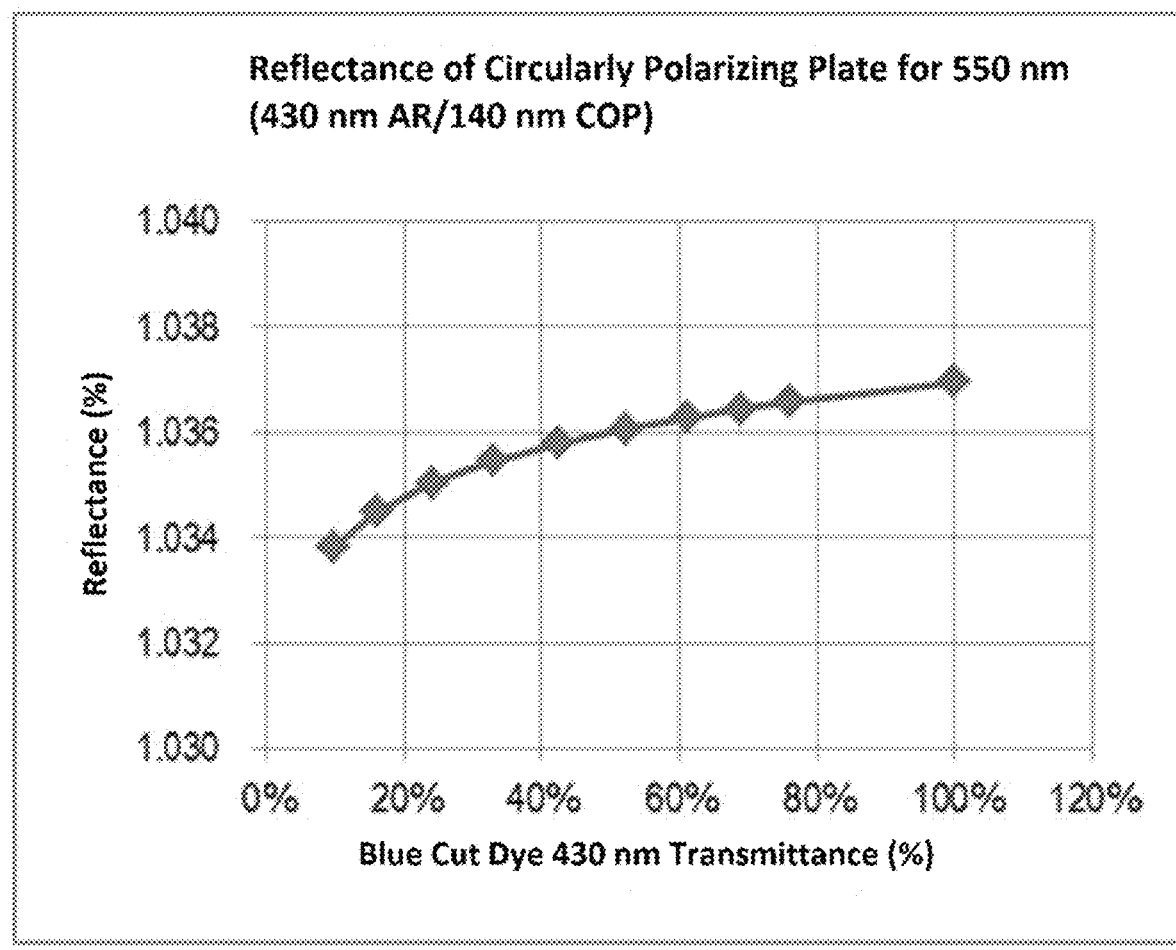

[Figure 11]
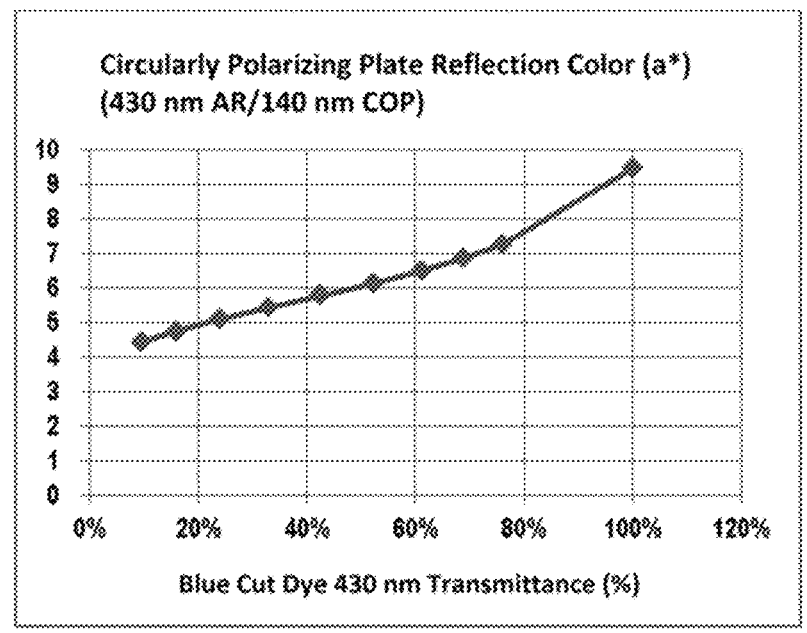
[Figure 12]
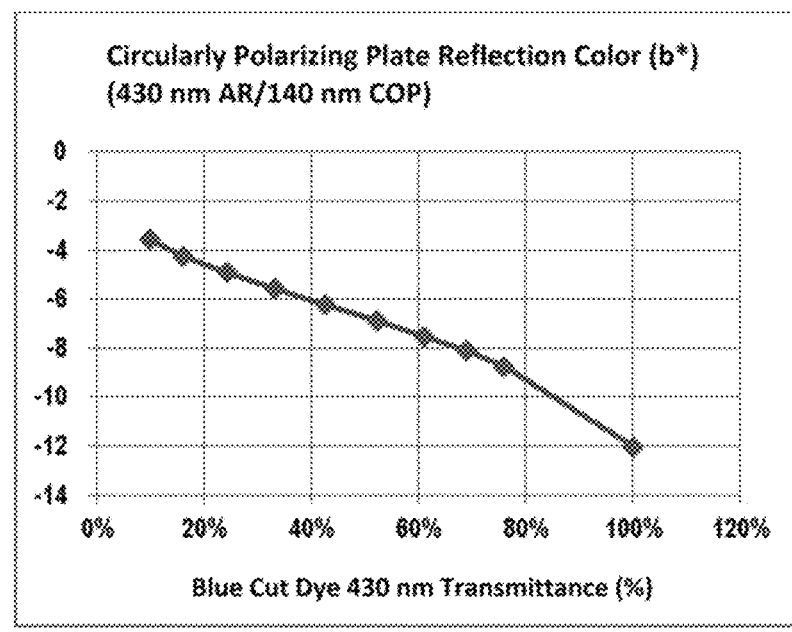

[Figure 13]
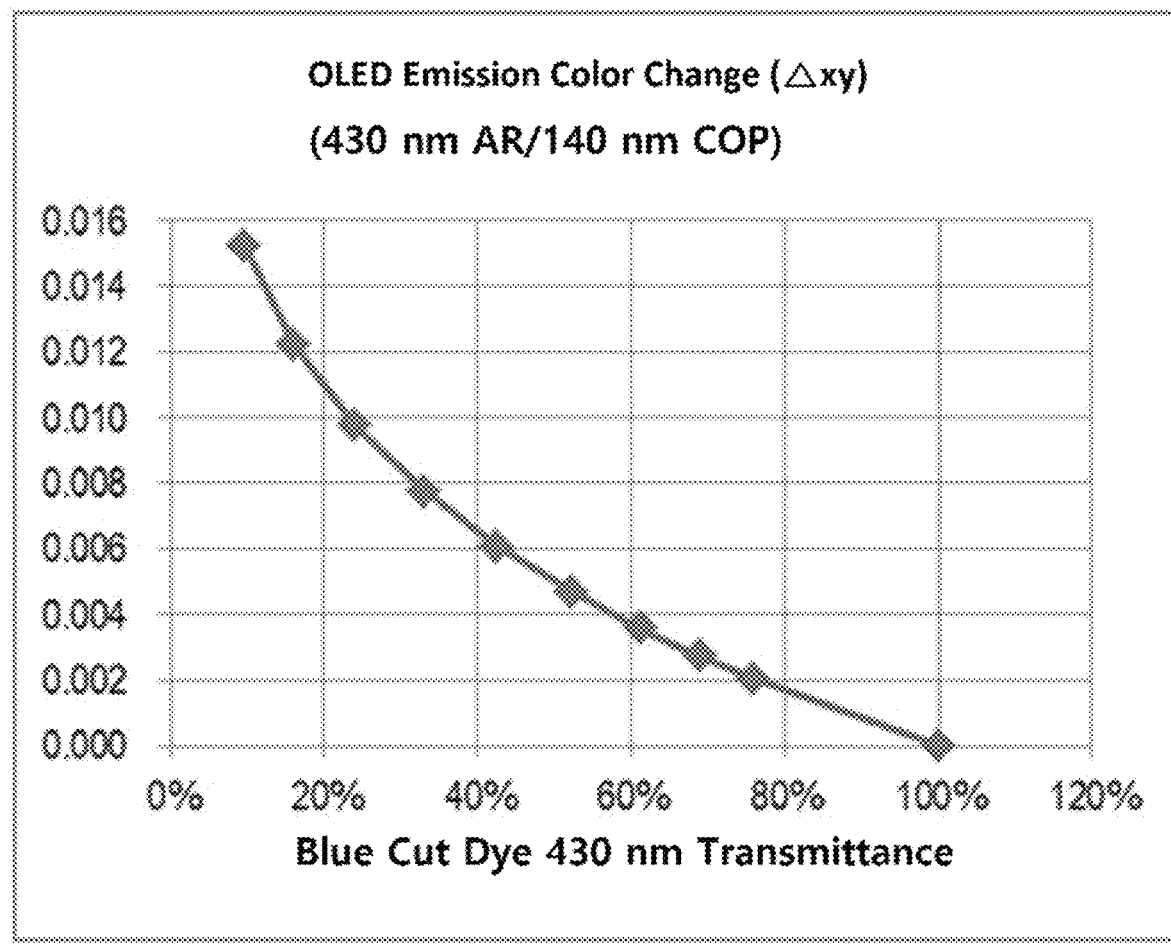

[Figure 14]
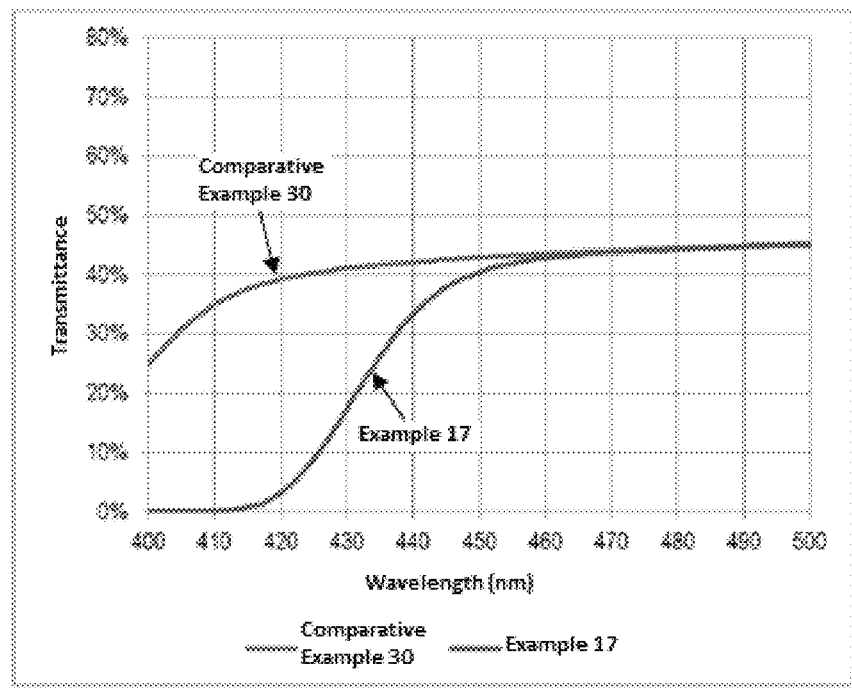
(a)
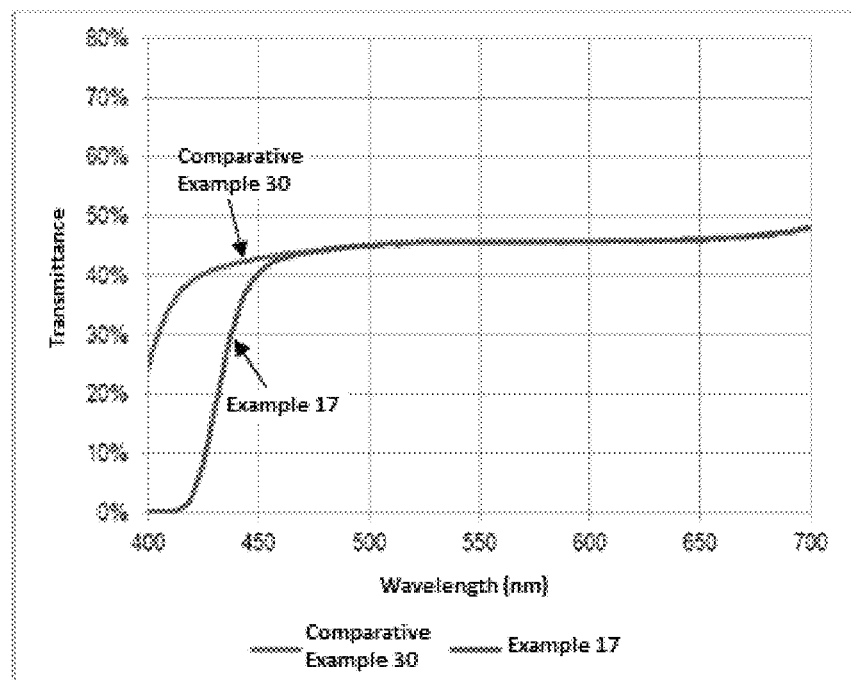
(b)

CIRCULARLY POLARIZING PLATE

CROSS-REFERENCE RELATED APPLICATION

This application is a National Stage Application of International Application No. PCT/KR2019/014806 filed on Nov. 4, 2019, which claims the benefit of priority based on Korean Patent Application No. 10-2018-0133585 filed on Nov. 2, 2018, the disclosure of which is incorporated herein by reference in its entirety.

TECHNICAL FIELD

The present application relates to a circularly polarizing plate.

BACKGROUND ART

So-called circularly polarizing plates, which basically comprise polarizers and retardation films, can be used to lower surface reflection in the off state of OLED panels. For example, Patent Document 1 (Japanese Laid-Open Patent Publication No. H8-321381) discloses a method of arranging a circularly polarizing plate toward a transparent electrode in an organic light emitting device. When the retardation film used for the circularly polarizing plate has a reverse dispersion property, it has a neutral reflection color sense to be most excellent, but is very expensive in terms of material properties.

DISCLOSURE

Technical Problem

The present application provides a circularly polarizing plate capable of improving a reflection color sense by using a retardation film having flat dispersion characteristics, and an OLED device comprising the circularly polarizing plate.

Technical Solution

The present application relates to a circularly polarizing plate. FIG. 1 illustratively shows a circularly polarizing plate of the present application. As shown in FIG. 1, the circularly polarizing plate (100) of the present application can comprise an antireflection film (10), a polarizer (20), a retardation film (30) and a pressure-sensitive adhesive layer (40) sequentially. The retardation film can have flat dispersion characteristics. The lowest reflection wavelength of the antireflection film can be 470 nm or less. The in-plane retardation value of the retardation film for a wavelength of 550 nm can be 136.0 nm or more. The circularly polarizing plate can have transmittance of 30% or less for a wavelength of 430 nm.

Through such a circularly polarizing plate, the present application can improve the reflection color sense even when using a retardation film having flat dispersion characteristics. Hereinafter, the circularly polarizing plate of the present application will be described in detail.

The reflectance of the antireflection film can be adjusted within a range that the reflectance measured in a state where the circularly polarizing plate is attached to an OLED panel described below is about 2.0% or less, 1.9% or less, 1.8% or less, 1.7% or less, or 1.6% or less. The reflectance means luminous reflectance Y (D65).

The reflectance of the anti-reflection film for a wavelength of 550 nm can be 0.6% to 1.2%. The transmittance of the antireflection film for light having a wavelength of 380 nm to 780 nm can be 90% or more, or 95% or more. The haze of the antireflection film can be, for example, 1% or less. The lower limit of the haze of the antireflection film is not particularly limited, but can be, for example, 0.01% or more.

The antireflection film can satisfy $L^*a^*b^*$ color coordinate criteria of $a^*>0$, $b^*>0$ and $a^*<b^*$ as determined according to the method defined in CIE 1976. Through the use of such an antireflection film, it can be more advantageous to improve the reflection color sense by using a retardation film having flat dispersion characteristics.

The antireflection film can have the lowest reflection wavelength of 470 nm or less, 465 nm or less, or 460 nm or less. In this specification, the lowest reflection wavelength means a wavelength at a point where the reflectance is lowest in a reflectance spectrum of the antireflection film for wavelengths. The lowest reflection wavelength of the antireflection film can be, for example, 390 nm or more, 395 nm or more, or 400 nm or more. The lowest reflectance of the antireflection film can be, for example, 1.0% or less. In this specification, the lowest reflectance means reflectance at a point where the reflectance is lowest in a reflectance spectrum of the antireflection film for wavelengths.

In the antireflection film, the reflectance spectrum for wavelengths can exhibit a U-shaped graph. FIG. 2(a) illustratively shows a U-shaped graph, and FIG. 2(b) illustratively shows a W-shaped graph. However, FIG. 2 is a diagram for illustratively describing the U-shaped graph, and the scope of the present application is not limited to FIG. 2. The antireflection film can have a reflection band showing the lowest reflectance in a wavelength range of 380 nm to 780 nm, for example, one wavelength band ($R_1$ region in FIG. 2(a)) that the reflectance is 1% or less. Such a U-shaped graph can be a concept distinguished from the W-shaped graph that the reflection band showing the lowest reflectance in a wavelength range of 380 nm to 780 nm is two regions ($R_1$ and $R_2$ in FIG. 2(b)). Through the use of such an antireflection film, it can be more advantageous to improve the reflection color sense by using a retardation film having flat dispersion characteristics.

When the optical properties of the antireflection film are within the above range, the material can be appropriately selected. For example, the antireflection film can comprise a low refractive layer. It is known to adjust the optical properties of the antireflection film within the above range. For example, the lowest reflection wavelength of the antireflection film tends to shift to longer wavelengths as the thickness of the low refractive layer becomes thicker, and to shift to shorter wavelengths as the thickness of the low refractive layer becomes thinner. For example, the lowest reflectance of the antireflection film tends to decrease as the refractive index of the low refractive material decreases.

The low refractive layer can comprise a low refractive material. In one example, the low refractive material can be low refractive inorganic particles. The refractive index of the low refractive inorganic particles for a wavelength of 550 nm can be, for example, 1.5 or less, 1.45 or less, or 1.40 or less. The lower limit of the refractive index can be, for example, 1.0 or more, 1.1 or more, 1.2 or more, or 1.3 or more.

In one example, the low refractive inorganic particles can be silica-based particles. The silica-based particles can be exemplified by, for example, hollow silica, mesoporous silica, and the like. In another example, as the low refractive inorganic particles, magnesium fluoride ($MgF_2$) can be used.

In one example, the low refractive inorganic particles can be nano-sized particles. The low refractive inorganic particles can have, for example, an average particle diameter in a range of 10 nm to 700 nm, 10 nm to 500 nm, 10 nm to 300 nm, 10 nm to 200 nm or 10 nm to 100 nm.

The thickness of the low refractive layer can be appropriately adjusted in consideration of the purpose of the present application. The thickness of the low refractive layer can be, for example, in a range of 10 nm to 500 nm, 10 nm to 300 nm, 10 nm to 200 nm, 50 nm to 200 nm or 100 nm to 200 nm. As described above, the lowest reflection wavelength of the antireflection film can be adjusted according to the thickness of the low refractive layer, and thus the thickness of the low refraction layer can be appropriately adjusted within the above range in consideration of the desired lowest reflection wavelength.

The low refractive layer can further comprise a binder resin. The low refractive inorganic particles can be present in a state dispersed in the binder resin.

The low refractive layer can comprise 30 to 600 parts by weight of the low refractive inorganic particles relative to 100 parts by weight of the binder resin. Specifically, the low refractive inorganic particles can be included in the range of 30 to 500 parts by weight, 30 to 400 parts by weight, 30 to 300 parts by weight, 30 to 200 parts by weight or 100 to 200 parts by weight relative to 100 parts by weight of the binder resin. When the content of the low refractive inorganic particles is excessive, the reflectance can be increased, and surface irregularities can be excessively generated to reduce surface properties such as scratch resistance and an antifouling property.

The binder resin can be, for example, a photopolymerizable compound. Specifically, the photopolymerizable compound can comprise a monomer or oligomer containing a (meth)acrylate group or a vinyl group. More specifically, the photopolymerizable compound can comprise a monomer or oligomer containing one or more, two or more, or three or more (meth)acrylate groups or vinyl groups.

A specific example of the monomer or oligomer containing a (meth)acrylate group can include pentaerythritol tri (meth)acrylate, pentaerythritol tetra(meth)acrylate, dipentaerythritol penta(meth)acrylate, dipentaerythritol hexa (meth)acrylate, tripentaerythritol hepta(meth)acrylate, hexamethylene diisocyanate, trimethylolpropane tri(meth) acrylate, trimethylolpropane polyethoxy tri(meth)acrylate, trimethylolpropane trimethacrylate, ethylene glycol dimethacrylate, butanediol dimethacrylate, butyl methacrylate or a mixture of two or more thereof, or a urethane-modified acrylate oligomer, an epoxide acrylate oligomer, an ether acrylate oligomer, a dendritic acrylate oligomer, or a mixture of two or more thereof. At this time, the molecular weight of the oligomer is preferably in a range of 1,000 to 10,000.

A specific example of the monomer or oligomer containing a vinyl group can include divinylbenzene, styrene or paramethylstyrene.

On the other hand, the photopolymerizable compound can further comprise a fluorine (meth)acrylate-based monomer or oligomer in addition to the above-described monomer or oligomer. When it further comprises the fluorine (meth) acrylate-based monomer or oligomer, the weight ratio of the fluorine (meth)acrylate-based monomer or oligomer to the monomer or oligomer containing a (meth)acrylate group or a vinyl group can be in a range of 0.1% to 10%.

The antireflection film can further comprise a base layer, and the low refractive layer can be formed on one side of the base layer.

The base layer can comprise a light transmissive resin. Thus, the base layer can be a light transmissive base layer. For example, the base layer can have transmittance of 90% or more for light having a wavelength of 380 nm to 780 nm. For example, the base layer can have haze of 1% or less for light having a wavelength of 380 nm to 780 nm. Through the use of such a base layer, it can be more advantageous to provide an antireflection film that can lower the reflectance while maintaining high transmittance.

The base layer can comprise one or more selected from the group consisting of a triacetyl cellulose (TAC) film, a cycloolefin polymer film, a poly(meth)acrylate-based film, a polycarbonate film, a polynorbornene film and a polyester film. The thickness of the base layer can be in a range of 10 μm to 300 μm in consideration of productivity or the like, but is not limited thereto.

The low refractive layer can be produced by coating a composition for forming a low refractive layer on a base layer and curing it. The composition for forming a low refractive layer can comprise the low refractive inorganic particles, and moreover, can further comprise the binder resin. As described below, when a hard coating layer is formed on the base layer, the low refractive layer can be formed by coating the composition for forming a low refractive layer on the hard coating layer and curing it.

A method of coating the composition for forming a low refractive layer is not particularly limited, which can be performed by a known coating method such as spin coating, bar coating, roll coating, gravure coating or blade coating.

A method of curing the composition for forming a low refractive layer is not particularly limited, which can be performed by, for example, irradiation of light or application of heat. The photo-curing of the composition for forming a low refractive layer can be performed by irradiating it with ultraviolet rays having a wavelength of 200 nm to 400 nm or visible light. In addition, the exposure amount upon light irradiation can be in a range of 100 mJ/cm$^2$ to 4,000 mJ/cm$^2$. The exposure time is not specifically limited, which can be changed suitably according to the exposure apparatus used, wavelength of irradiation light, or exposure amount.

The antireflection film can further comprise a hard coating layer. The hard coating layer can be present between the base layer and the low refractive layer. The hard coating layer can improve the hardness of the antireflection film. Through this, the antireflection film can be used as an optical film, that is, a window film, positioned at the outermost portion of the display device.

The refractive index range of the hard coat layer can be appropriately selected within a range that does not impair the purpose of the present application. For example, the hard coating layer can have a refractive index of, for example, 1.5 or less, 1.40 or 1.30 or less for a wavelength of 550 nm. The lower limit of the refractive index can be, for example, 1.0 or more, 1.1 or more, or 1.2 or more.

As the hard coating layer, a conventionally known hard coating layer can be used without great limitation. The hard coating layer can comprise, for example, a photocurable resin. The photocurable resin can be a light transmissive resin. The photocurable resin included in the hard coat layer is a polymer of a photocurable compound that can cause a polymerization reaction when light such as ultraviolet rays is irradiated, which can be conventional in the art. Specifically, the photocurable resin can comprise one or more selected from the reactive acrylate oligomer group consisting of a urethane acrylate oligomer, an epoxide acrylate oligomer, a polyester acrylate and a polyether acrylate; and the multifunctional acrylate monomer group consisting of dipentaerythritol hexaacrylate, dipentaerythritol hydroxy pentaacrylate, pentaerythritol tetraacrylate, pentaerythritol triacrylate, trimethylene propyl triacrylate, propoxylated glycerol triacrylate, trimethylpropane ethoxy triacrylate, 1,6-hexanediol diacrylate, propoxylated glycerol triacrylate, tripropylene glycol diacrylate and ethylene glycol diacrylate.

The hard coat layer can further comprise organic or inorganic particulates dispersed in the photocurable resin. A specific example of the organic or inorganic particulates included in the hard coating layer is not limited, but for example, the organic or inorganic particulates can be one or more organic particulates selected from the group consisting of an acrylic resin, a styrene resin, an epoxide resin and a nylon resin, or one or more inorganic particulates selected from the group consisting of silicon oxide, titanium dioxide, indium oxide, tin oxide, zirconium oxide and zinc oxide. The particle diameter of the organic or inorganic particulates is not particularly limited, but for example, the organic particulates can have a particle diameter of 1 to 10 and the inorganic particles can have a particle diameter of 1 nm to 500 nm or 1 nm to 300 nm. The particle diameter of the organic or inorganic particulates can be defined as a volume average particle diameter.

The thickness of the hard coating layer can be, for example, in a range of 0.1 μm to 100 μm. The pencil hardness of the antireflection film to which the hard coating layer is applied can be, for example, 2H or more or 4H or more. Within this range, even when the antireflection film is used as the outermost window film of the display device, it can be advantageous to protect a transparent display element from the outside.

The hard coat layer can be produced by, for example, coating a composition for forming a hard coat layer on a base layer and curing it. The composition for forming a hard coat layer can comprise the photocurable resin, and can further comprise the organic or inorganic particulates, if necessary.

A method of curing the composition for forming a hard coating layer is not particularly limited, which can be performed by, for example, irradiation of light or application of heat. The photo-curing of the composition for forming a hard coating layer can be performed by irradiating it with ultraviolet rays having a wavelength of 200 nm to 400 nm or visible light. In addition, the exposure amount upon light irradiation can be in a range of 100 mJ/cm$^2$ to 4,000 mJ/cm$^2$. The exposure time is not specifically limited, which can be changed suitably according to the exposure apparatus used, wavelength of irradiation light, or exposure amount.

The composition for forming a low refractive layer or the composition for forming a hard coating layer can further comprise a solvent. The solvent can be an organic solvent. As the organic solvent, a hydrocarbon-based, halogenated hydrocarbon-based or ether-based solvent can be used. An example of the hydrocarbon-based solvent can include a solvent of pentane, hexane, heptane, cyclohexane, n-decane, n-dodecane, benzene, toluene, xylene, methoxy benzene or the like. An example of the halogenated hydrocarbon-based solvent can include a solvent of carbon tetrachloride, chloroform, 1,2-dichloroethane, dichloromethane, chlorobenzene or the like. An example of the ether-based solvent can include a solvent of tetrahydrofuran, dioxane, propylene glycol mono methyl ether acetate or the like.

The composition for forming a low refractive layer or the composition for forming a hard coating layer can further comprise any additive. Such an additive can be exemplified by, for example, a curing agent or catalyst or an initiator, such as a radical initiator or a cationic initiator, to assist in curing a curable resin, a thixotropy-imparting agent, a leveling agent, an antistatic agent, an antifoaming agent, an antioxidant, a radical generating material, organic and inorganic pigments or dyes, a dispersant, various fillers such as thermally conductive fillers or insulating fillers, a functional polymer or a light stabilizer, and the like, but is not limited thereto.

In this specification, the term polarizer means a film, sheet or element having a polarization function. The polarizer is a functional element capable of extracting light that vibrates in one direction from incident light that vibrates in various directions.

In this specification, the terms, polarizer and polarizing plate, refer to objects that are distinguished from each other. The term polarizer means a film, sheet or element itself having a polarizing function, and the term polarizing plate means an object comprising the polarizer and another element laminated on one or both sides of the polarizer. Here, another element can be exemplified by a protective film of a polarizer, an antireflection film, a retardation film, a pressure-sensitive adhesive layer, an adhesive layer, a surface treatment layer, and the like, but is not limited thereto. According to the circularly polarizing plate of the present application, it may or may not comprise a protective film attached to one side or both sides of the polarizer. The antireflection film and/or the retardation film can act as a protective base material of the polarizer even if not including a separate protective film attached to one side or both sides of the polarizer.

In the present application, as the polarizer, an absorptive linear polarizer can be used. As such a polarizer, a PVA (poly(vinyl alcohol)) polarizer is known. Basically, in the present application, a known polarizer can be used as the polarizer. In one example, as the known PVA (poly(vinyl alcohol)) polarizer, a polarizer having the following characteristics can be applied.

The transmittance of the polarizer for a wavelength of 550 nm can be in a range of 40% to 50%. The transmittance can specifically be in the range of 42% to 43% or 43.5% to 44.5%. The transmittance can mean single transmittance of the polarizer for a wavelength of 550 nm. The single transmittance of the polarizer can be measured using, for example, a spectrometer (V7100, manufactured by Jasco). For example, after the air is set to the base line in a state where the polarizer sample (not including the upper and lower protective films) is placed on the apparatus and each transmittance is measured in a state in which the axis of the polarizer sample is vertically and horizontally aligned with the axis of the reference polarizer, the single transmittance can be calculated.

In general, the PVA-based absorptive linear polarizer exhibits the above single transmittance, and in the present application, such a PVA-based absorptive linear polarizer can be applied, but the kind of the polarizer that can be applied is not limited to the above, as long as it exhibits the above single transmittance.

The PVA-based polarizer can generally comprise a PVA film or sheet and an anisotropic absorbent material, such as a dichroic dye or iodine, adsorbed and oriented on the PVA film or sheet.

The PVA film or sheet can be obtained, for example, by gelling polyvinyl acetate. The polyvinyl acetate can be exemplified by a homopolymer of vinyl acetate; and a copolymer of vinyl acetate and other monomers, and the like. Here, the other monomers copolymerized with vinyl acetate can be exemplified by one or two or more of an unsaturated carboxylic acid compound, an olefinic compound, a vinyl ether compound, an unsaturated sulfonic acid compound and an acrylamide compound having an ammonium group, and the like.

The polyvinyl acetate has generally a gelation degree of about 85 mol % to about 100 mol % or 98 mol % to 100 mol % or so. The polyvinyl alcohol in the linear polarizer can have generally a polymerization degree of about 1,000 to about 10,000 or about 1,500 to about 5,000.

The PVA polarizer is produced via a dyeing process and a stretching process on the PVA film or sheet. If necessary, the production process of the polarizer can further comprise a swelling, crosslinking, cleaning and/or drying process.

Here, for example, the dyeing process is a process for adsorbing iodine, which is an anisotropic absorbent material, on a PVA film or sheet, and can be performed by immersing the PVA film or sheet in a treatment tank containing iodine and potassium iodide, where in this procedure, the single transmittance can be controlled by a method of controlling the concentration of iodine and potassium iodide in the treatment tank.

In the dyeing process, the PVA film or sheet is immersed in a dyeing solution or a crosslinking solution containing an iodide such as iodine ($I_2$) or KI and/or a boric acid compound (boric acid or a borate) or the like, where in this procedure, the anisotropic absorbent material such as iodine is adsorbed on the PVA film or sheet. Accordingly, in the procedure, the kind or amount of the anisotropic absorbent material adsorbed on the polarizer is determined depending on the concentration of the compound in the dyeing solution, whereby the absorption rate and transmittance of the polarizer for light having a specific wavelength can be determined.

For example, a species of the iodine compound that can be present in the dyeing solution can be $I^-$, $I_2$, $I_3^-$ or $I_5^-$ and the like derived from an iodide ($M^+I^-$) and iodine ($I_2$). Among these compounds, $I^-$ has an absorption wavelength range of about 190 nm to 260 nm and its effect on the color sense is not significant, $I_2$ has an absorption wavelength range of about 400 nm to 500 nm and its color sense is mainly red, $I_3^-$ has an absorption wavelength range of about 250 nm to 400 nm and its color sense is mainly yellow, $I_5^-$ of the linear structure has no observed absorption wavelength range and its effect on the color sense is not significant, and $I_5^-$ of the curved structure has an absorption wavelength range of about 500 nm to 900 nm and its color sense is mainly blue.

The retardation film can have flat dispersion characteristics. In this specification, the flat dispersion characteristic means a characteristic in which a retardation value is constant as the wavelength increases. In one example, the flat dispersion characteristic can mean that the R (450)/R (550) value of the retardation film is 0.99 to 1.01. Also, according to the flat dispersion characteristic, the R (650)/R (550) value of the retardation film can be 0.99 to 1.01. Here, $R(\lambda)$ means an in-plane retardation value for a wavelength of $\lambda$ nm. The retardation film having flat dispersion characteristics has an advantage of being able to obtain the product marketed at low cost compared with the retardation film having reverse dispersion characteristics. In addition, the retardation film having flat dispersion characteristics is also advantageous in a process yield since no additional coating process is required.

In this specification, the in-plane retardation value can be calculated according to Equation 1 below.

$$Rin = d \times (nx - ny) \quad \text{Equation 1}$$

In Equation 1, Rin is in-plane retardation, nx and ny are an x-axis direction refractive index and a y-axis direction refractive index of a retardation film, respectively, and d is the thickness of the retardation film. Such definitions can apply equally herein, unless otherwise specified. Here, the x-axis direction means the slow axis direction on the surface of the retardation film, the y-axis direction means a planar direction (fast axis direction) perpendicular to the x-axis, and the z-axis direction means the direction of the normal of the plane formed by the x-axis and the y-axis, for example, the thickness direction of the retardation film. In this specification, the slow axis means an axis parallel to the direction in which the refractive index is highest based on the plane direction of the retardation film. Unless otherwise specified while referring to the refractive index herein, the refractive index is a refractive index for light having a wavelength of about 550 nm.

The in-plane retardation value of the retardation film for a wavelength of 550 nm can be 137.5 nm or more. The in-plane retardation value of the retardation film for a wavelength of 550 nm can be, for example, 143 nm or less. The in-plane retardation value of the retardation film for a wavelength of 550 nm can be, more specifically, in the range of 137.5 nm to 141.0 nm. Within this range, it can be suitable for improving reflective visual appreciation using a flat dispersion retardation film.

A method of adjusting an in-plane retardation value of a retardation film is well-known. In one example, when the retardation film is a polymer stretched film, the in-plane retardation value can be adjusted by adjusting the material, thickness, and draw ratio of the polymer film. In another example, when the retardation film is a liquid crystal polymerization film, the in-plane retardation value can be adjusted by adjusting the thickness of the liquid crystal layer, the birefringence value of the liquid crystal, and the like.

The slow axis of the retardation film can be 43 degrees to 47 degrees, 44 degrees to 46 degrees, preferably 45 degrees with the absorption axis of the polarizer. Through this, it is possible to improve the reflective visual appreciation of the circularly polarizing plate using the flat dispersion retardation film. In this specification, the angle formed by an axis of A with respect to an axis of B means that both an angle formed by the A axis in a clockwise direction and an angle formed by the A axis in a counterclockwise direction are included based on the B axis at 0 degrees.

The thickness of the retardation film can be, for example, in a range of 10 μm to 100 μm in the case of a polymer stretched film. In another example, the thickness of the retardation film can be, for example, in a range of 0.1 μm to 5 μm in the case of a liquid crystal polymerization film.

The retardation film can be a liquid crystal polymerization film or a polymer stretched film. Specifically, as the retardation film, a stretched polymer layer in which a polymer film capable of imparting optical anisotropy by stretching is stretched in an appropriate manner or a liquid crystal layer can be used. As the liquid crystal layer, a liquid crystal polymer layer or a cured layer of a polymerizable liquid crystal compound can be used.

The liquid crystal polymerization film can comprise a base layer and a liquid crystal layer on one side of the base layer. To the base layer of the liquid crystal polymerization film, the content related to the base layer of the antireflection film can be equally applied. Therefore, the light transmissive base material can also be used as the base layer of the liquid crystal polymerization film. The liquid crystal layer can comprise a polymerizable liquid crystal compound in a polymerized state. In this specification, the term "polymerizable liquid crystal compound" means a compound containing a moiety capable of exhibiting liquid crystallinity, such as a mesogen skeleton, and also containing one or more polymerizable functional groups. Such polymerizable liquid crystal compounds are variously known under the so-called RM (reactive mesogen). The polymerizable liquid crystal compound can be contained in the polymerized form in the cured layer, that is, the above-described polymerized unit, which means a state where the liquid crystal compound is polymerized to form skeletons of the liquid crystal polymer such as main chains or side chains in the cured layer.

The polymerizable liquid crystal compound can be a monofunctional or multifunctional polymerizable liquid crystal compound. Here, the monofunctional polymerizable liquid crystal compound can be a compound having one polymerizable functional group and the multifunctional polymerizable liquid crystal compound means a compound containing two or more polymerizable functional groups. In one example, the polyfunctional polymerizable liquid crystal compound can comprise 2 to 10, 2 to 8, 2 to 6, 2 to 5, 2 to 4, 2 to 3, or 2 or 3 polymerizable functional groups.

It is known that a polymerizable liquid crystal composition prepared by combining such a polymerizable liquid crystal compound with other components such as an initiator, a stabilizer and/or a non-polymerizable liquid crystal compound is cured in a state where it is oriented on an alignment film to form the cured layer expressed with birefringence. The retardation film having flat dispersion characteristics can be produced by including a polymerizable liquid crystal compound having flat dispersion characteristics.

As the polymer stretched film, for example, a polymer layer comprising, as a polymer material, a polyolefin such as polyethylene or polypropylene, a cycloolefin polymer (COP) such as polynorbornene, polyvinyl chloride, polyacrylonitrile, polysulfone, an acrylic resin, polycarbonate, a polyester such as polyethylene terephthalate, a polyacrylate, polyvinyl alcohol or a cellulose ester polymer such as TAC (triacetyl cellulose), or a copolymer of two or more monomers among the monomers forming the polymers, and the like can be used.

A method for obtaining a polymer stretched film is not particularly limited. For example, it can be obtained by molding the polymer material in the form of a film, and then stretching it. The molding method in the form of a film is not particularly limited, but it is possible to be molded into a film by a known method such as injection molding, sheet molding, blow molding, injection blow molding, inflation molding, extrusion molding, foam molding and cast molding, and a secondary processing molding method such as pressure molding and vacuum molding can also be used. Among them, extrusion molding and cast molding are preferably used. At this time, an unstretched film can be extruded and molded by using, for example, an extruder equipped with a T-die, a circular die or the like. When a molded product is obtained by extrusion molding, a previously melt-kneaded material of various resin components, additives, and the like can also be used, and the molded product can also be molded via melt-kneading at the time of extrusion molding. The unstretched film can also be cast-molded by dissolving various resin components with a solvent common to various resin components, for example, a solvent such as chloroform and methylene dichloride, and then casting, drying and solidifying them.

In the polymer stretched film, the molded film can be uniaxially stretched in a mechanical direction (MD, longitudinal direction or length direction) and uniaxially stretched in a direction going straight to the mechanical direction (TD; transverse direction, cross direction or width direction), and a biaxially stretched film can also be produced by stretching it by a sequential biaxial stretching method of roll stretching and tenter stretching, a simultaneous biaxial stretching method by tenter stretching, a biaxial stretching method by tubular stretching, etc.

The control of the retardation value in the polymer stretched film can generally be performed by controlling stretching conditions of the film. This is because the retardation value is caused by the thickness of the film itself due to the stretching of the film. In the case of biaxial stretching, the ratio (MD direction/TD direction) of draw ratios in the mechanical direction (MD direction) and the direction (TD direction) going straight to the mechanical direction is preferably 0.67 or less or 1.5 or more, more preferably 0.55 or less or 1.8 or more, and most preferably 0.5 or less or 2 or more.

The pressure-sensitive adhesive layer can perform a function of attaching the circularly polarizing plate to the display panel. The pressure-sensitive adhesive layer can comprise a pressure-sensitive adhesive resin. As the pressure-sensitive adhesive resin, for example, a light transmissive pressure-sensitive adhesive resin can be used. For example, a pressure-sensitive adhesive resin can be used such that the transmittance of the pressure-sensitive adhesive layer formed by the pressure-sensitive adhesive resin for a wavelength of 380 nm to 780 nm is about 80% or more, 85% or more, 90% or more, or 95% or more. The transmittance means a percentage of a light quantity transmitted through the pressure-sensitive adhesive layer to a light quantity incident on the pressure-sensitive adhesive layer. The pressure-sensitive adhesive resin can comprise, for example, one or more selected from the group consisting of an acrylic resin, a silicone-based resin, an ester-based resin, a urethane-based resin, an amide-based resin, an ether-based resin, a fluorine-based resin and a rubber-based resin.

The thickness of the pressure-sensitive adhesive layer can be, for example, in a range of 15 μm to 30 μm.

The method of forming a pressure-sensitive adhesive layer on one side of a retardation film is not particularly limited. In one example, it can be performed by a process of applying a pressure-sensitive adhesive composition comprising the pressure-sensitive adhesive resin to a release film to form a pressure-sensitive adhesive layer, and then transferring the pressure-sensitive adhesive layer to one side of a retardation film and removing the release film. In another example, the pressure-sensitive adhesive layer can be formed by applying a pressure-sensitive adhesive composition directly to one side of the retardation film.

The circularly polarizing plate can comprise a dye. The dye functions to control the transmittance of the circularly polarizing plate. In this specification, the dye means a material capable of intensively absorbing and/or modifying light in at least part or the entire range within a visible light region, for example, a wavelength range of 380 nm to 780 nm.

The circularly polarizing plate comprising the dye can have transmittance of 30% or less, or 28% or less for a wavelength of 430 nm. Since the circularly polarizing plate can contribute to neutral reflection colors by satisfying such a transmittance range, it can improve the reflective visual appreciation even when using a retardation film having flat dispersion characteristics. More specifically, the circularly polarizing plate comprising the dye can have transmittance of 35% or more or 40% or more for wavelengths of 460 nm and 550 nm, respectively.

The lower limit of the transmittance of the circularly polarizing plate comprising the dye for a wavelength of 430 nm can be 4% or more. When the transmittance is too low, the color change of the white light emitted from an OLED becomes too large, so that it is preferable that the lower limit of the transmittance in the pressure-sensitive adhesive layer comprising the dye is in the above range.

The dye can be appropriately selected within a range that the circularly polarizing plate can exhibit the transmittance characteristics. The dye can be, for example, a dye exhibiting absorption in the blue region. The dye can exhibit maximum absorbance in the blue region. The absorbency or absorbance of the dye herein can be determined from the transmission spectrum measured for the layer formed by mixing the dye with the light transmissive resin. In this specification, the light transmissive resin means a layer that the transmittance for a wavelength of 380 nm to 780 nm measured with respect to the layer formed by the resin alone is about 80% or more, 85% or more, 90% or more, or 95% or more.

The dye having such absorption characteristics can be abbreviated herein as a blue cut dye. The blue region can be, for example, in the wavelength range of 370 nm to 430 nm. Therefore, the circularly polarizing plate comprising the dye can also exhibit a maximum absorbance within the range of 370 nm to 430 nm of the wavelength range of 380 nm to 780 nm. The dye absorbs the blue region, and thus can exhibit a yellow color sense. The dye can also be a single dye or a mixture of two or more dyes within a range that the circularly polarizing plate exhibits the transmittance characteristics.

As the dye, one or more dyes selected from the group consisting of an anthraquinone-based dye, a methane-based dye, an azomethine-based dye, an oxazine-based dye, an azo-based dye, a styryl-based dye, a coumarin-based dye, a porphyrin-based dye, a dibenzofuranone-based dye, a diketopyrrolopyrrole-based dye, a rhodamine-based dye, a xanthene-based dyes and a polymethine-based dye can be used.

The dye can be included in any layer included in the circularly polarizing plate within a range that the circularly polarizing plate can exhibit the transmittance.

For example, the dye can be included in one or more of the antireflection film, the retardation film and the pressure-sensitive adhesive layer. In one example, the dye can be included in the antireflection film. As described above, the antireflection film can comprise a base layer and a low refractive layer on one side of the base layer. In this case, the dye can be included in the base layer of the antireflection film. Alternatively, as described above, the antireflection film can further comprise a hard coating layer between the base layer and the low refractive layer. In this case, the dye can also be included in the hard coating layer of the antireflection film. In one example, the dye can be included in the retardation film. As described above, when the retardation film is a liquid crystal polymerization film, the retardation film can comprise a base layer and a liquid crystal layer on one side of the base layer. In this case, the dye can be included in the base layer of the retardation film. On the other hand, when the retardation film is a polymer stretched film, the dye can be included in the polymer stretched film. In one example, the dye can also be included in the pressure-sensitive adhesive layer.

In another example, the circularly polarizing plate can also further comprise a separate layer for use to comprise the dye, in addition to the antireflection film, the retardation film and the pressure-sensitive adhesive layer. Such a separate layer can also comprise the dye, while comprising a light transmissive resin as a main component. The position of the separate layer is not particularly limited, and it can be formed on one side or both sides of the antireflection film, the polarizer, the retardation film or the pressure-sensitive adhesive layer. However, the pressure-sensitive adhesive layer is used for attaching the circularly polarizing plate to the panel, so that it can be preferable that the separate layer does not exist on the attaching surface of the pressure-sensitive adhesive layer.

The layer comprising the dye can have transmittance of 75% or less, 70% or less, 65% or less, or 60% or less for a wavelength of 430 nm. Since the layer comprising the dye can contribute to the neutral reflection colors by satisfying this transmittance range, it can improve reflective visual appreciation even when using a retardation film having flat dispersion characteristics. More specifically, the layer comprising the dye can have transmittance of 90% or more for wavelengths of 460 nm and 550 nm, respectively. The lower limit of transmittance of the layer comprising the dye for a wavelength of 430 nm can be 10% or more. When the transmittance is too low, the color change of the white light emitted from an OLED becomes too large, so that it is preferable that the lower limit of the transmittance in the layer comprising the dye is in the above range.

The content of the dye in the layer comprising the dye can be appropriately selected in consideration of the purpose of the present application. As described above, the layer comprising the dye can comprise a light transmissive resin as a main component, and can further comprise the dye. The content of the dye in the layer comprising the dye can be included, for example, in a range of 0.5 parts by weight to 10 parts by weight relative to 100 parts by weight of the light transmissive resin. When the content of the dye is within the above range, it can be suitable to improve the reflective visual appreciation of the circularly polarizing plate, and as the content of the dye increases within the above range, it can be closer to the desired reflection color. However, when the content of the dye is too high, precipitation can also occur due to insufficient solubility of the dye and affect the physical properties of each layer, so that it can be preferable to be controlled within the above range.

If the weight of the dye in the layer comprising the dye is the same, the same transmittance characteristics can be obtained by changing the thickness of the layer comprising the dye. Therefore, when the transmittance of the layer comprising the dye is intended to increase within the above-mentioned range, there is a method that the thickness of the layer comprising the dye is fixed and the weight of the dye is reduced to lower the concentration of the dye, or the thickness of the layer comprising the dye, in which the concentration of the dye is the same, is lowered to reduce the weight of the dye.

The present application also relates to a display device comprising the circularly polarizing plate. As the display device, an OLED (organic light-emitting diode) device can be exemplified.

FIG. 3 illustratively shows an OLED device of the present application. As shown in FIG. 3, the OLED device can comprise an OLED panel (200) and a circularly polarizing plate (100) disposed on one side of the OLED panel. The OLED panel and the circularly polarizing plate can be attached via a pressure-sensitive adhesive layer (40).

The OLED panel can comprise a substrate, a lower electrode, an organic light-emitting layer and an upper electrode sequentially. The organic light-emitting layer can comprise an organic material that can emit light when a voltage has been applied to the lower electrode and the upper electrode. One of the lower electrode and the upper electrode can be a positive electrode (anode) and the other can be a negative electrode (cathode). The positive electrode is an electrode into which holes are injected, which can be made of a conductive material having a high work function, and the negative electrode is an electrode into which electrons are injected, which can be made of a conductive material having a low work function. In general, a transparent metal oxide layer, such as ITO or IZO, having a large work function can be used as the positive electrode, and a metal electrode having a low work function can be used as the negative electrode. In general, the organic light-emitting layer is transparent, and thus a transparent display can be realized when the upper and lower electrodes are made transparent. In one example, when the thickness of the metal electrode is made very thin, a transparent display can be realized.

The OLED panel can further comprise an encapsulation substrate, which functions to prevent inflow of moisture and/or oxygen from the outside, on the upper electrode. It can further comprise auxiliary layers between the lower electrode and the organic light-emitting layer and between the upper electrode and the organic light-emitting layer. The auxiliary layer can include a hole transporting layer, a hole injecting layer, an electron injecting layer, and an electron transporting layer, for balancing electrons and holes, but is not limited thereto.

The circularly polarizing plate can be disposed on the side where the light comes out from the OLED element. For example, in the case of a bottom emission structure in which light is emitted toward the base substrate, it can be disposed outside the base substrate, and in the case of a top emission structure in which light is emitted toward the encapsulation substrate, it can be disposed outside the encapsulation substrate. The circularly polarizing plate can improve visibility and display performance by preventing external light from being reflected by a reflective layer made of metal such as electrodes and wiring of the OLED panel and from coming out of the OLED panel.

In one example, the OLED panel can further comprise a substrate on which a color filter is formed. The substrate on which the color filter is formed can be disposed on the opposite side on which the metal electrode of the OLED panel is disposed. At this time, the OLED panel can have a structure that sequentially comprises a substrate on which a color filter is formed, a transparent metal oxide electrode (positive electrode), a light-emitting layer, a metal electrode (negative electrode) and a base substrate. The color filter can comprise red, green, and blue regions, and can further comprise a black matrix for dividing the regions. The case where the color filter is present on the substrate of the OLED panel can exhibit low reflectance as compared to the case where the color filter is not present. Specifically, when the red, green, and blue color filters are positioned in front of the light-emitting layer of the OLED, it is because the high reflectance at the metal electrode located on the back side of the light-emitting layer is reduced.

The average reflectance of the OLED panel in a range of 410 nm to 500 nm can be 45% or less. The average reflectance of the OLED panel in a range of 410 nm to 500 nm can be 20% or more. In addition, the average reflectance of the OLED panel in a range of 600 nm to 650 nm can be 50% or less. The average reflectance of the OLED panel in a range of 600 nm to 650 nm can be 20% or more. Through the application of such an OLED panel, it can be more advantageous to improve the reflective visual appreciation while using a retardation' film having flat dispersion characteristics.

As described above, an OLED device in which the circularly polarizing plate of the present application is applied to an OLED panel can exhibit excellent reflective visual appreciation. In one example, the reflectance of the OLED panel, to which the circularly polarizing plate is attached, at 550 nm can be 1.5% or less, 1.4% or less, or 1.3% or less. The reflectance can be specifically 1.1% or less, or 1.0% or less. It means that the lower the reflectance of the OLED panel to which the circularly polarizing plate is attached, the better the reflective visual appreciation, and thus the lower limit is not particularly limited, but can be, for example, 0.1% or more.

In one example, the reflection colors of the OLED panel, to which the circularly polarizing plate is attached, can have, based on L*a*b* color coordinates, a* values of less than 8 and b* values of more than −8.5. The lower limit of the a* can be more than 0, and the upper limit of the b* can be less than 0. When the reflectance and the reflection colors of the OLED panel, to which the circularly polarizing plate is attached, are within the above ranges, it can be said that the reflective visual appreciation is excellent. Also, among the a* and b* values, the range of the a* values can be particularly more important, which is because the reflection color sense of red light generally deteriorates viewers' visual appreciation more than blue light. In addition, when the reflectance of the OLED panel for a wavelength of 550 nm is in the above range, it can be more advantageous to improve the reflective visual appreciation because they feel blacker even if the absolute values of a* and b* become large.

Advantageous Effects

The present application can provide a circularly polarizing plate which can improve a reflection color sense by using a retardation film having flat dispersion characteristics, and an OLED device comprising the circularly polarizing plate.

BRIEF DESCRIPTION OF DRAWINGS

FIG. 1 illustratively shows a circularly polarizing plate of the present application.

FIGS. 2(a) and 2(b) illustratively show reflectance spectra of antireflection films.

FIG. 3 illustratively shows an OLED device of the present application.

FIG. 4 is a transmittance spectrum of a pressure-sensitive adhesive layer comprising a blue cut dye.

FIG. 5 shows reflectance spectra of an antireflection film.

FIG. 6 shows evaluation results of reflective visual appreciation in Evaluation Example 3.

FIG. 7 shows evaluation results of reflective visual appreciation in Evaluation Example 3.

FIG. 8 shows evaluation results of reflective visual appreciation in Evaluation Example 3.

FIG. 9 shows evaluation results of reflective visual appreciation in Evaluation Example 3.

FIG. 10 shows evaluation results of reflective visual appreciation in Evaluation Example 4.

FIG. 11 shows evaluation results of reflective visual appreciation in Evaluation Example 4.

FIG. 12 shows evaluation results of reflective visual appreciation in Evaluation Example 4.

FIG. 13 shows evaluation results of reflective visual appreciation in Evaluation Example 4.

FIGS. 14(a) and 14(b) show results of measuring transmittance of the circularly polarizing plates of Comparative Example 30 and Example 17.

EXAMPLES

Hereinafter, the present application will be described in detail through examples complying with the present application and comparative examples not complying with the present application, but the scope of the present application is not limited to the following examples.

Examples 1 to 12 and Comparative Examples 1 to 28

Circularly Polarizing Plate

A circularly polarizing plate comprising an antireflection film, a polarizer, a retardation film and an adhesive layer sequentially was prepared.

The antireflection film was produced by coating a hard coating layer having a thickness of about 5 μm on a triacetyl cellulose (TAC) base film and then coating a low refractive layer including hollow silica nanoparticles on the hard coating layer. The low refractive layer had a refractive index of about 1.3 to 1.4 for a wavelength of 550 nm. The lowest reflectance of the antireflection film can be adjusted by controlling the refractive index of the low refractive layer. Specifically, the lower the refractive index of the low refractive layer, the lower the lowest reflectance of the antireflection film at the lowest reflection wavelength. The thickness of the low refractive layer is controlled in a range of about 70 nm to 150 nm, and the lowest reflection wavelength of the antireflection film can be adjusted by controlling the thickness of the low refractive layer. Specifically, the lowest reflection wavelength of the antireflection film shifts to longer wavelengths as the thickness of the low refractive layer becomes thicker, and shifts to shorter wavelengths as the thickness of the low refractive layer becomes thinner. By adjusting the thickness within the thickness range to change the lowest reflection wavelength of the antireflection film, 8 antireflection films were prepared as in Table 1 below.

The retardation film was a product produced by obliquely stretching a COP film from Zeon, which had an R (450)/R (550) value of 1, wherein the angle formed by the slow axis of the retardation film with respect to the light absorption axis of the polarizer was 45 degrees, and samples were prepared by changing in-plane retardation values for a wavelength of 550 nm w as in Tables 1 to 5 below.

As the polarizer, a PVA-based polarizer having transmittance of 44% was used.

The pressure-sensitive adhesive layer was laminated on the retardation film surface by using a product coated between release films. As the pressure-sensitive adhesive layer, a commercially available acrylic pressure-sensitive adhesive for polarizing plates was used, and a blue cut dye was included in the pressure-sensitive adhesive layer. The pressure-sensitive adhesive layer comprising the blue cut dye had a transmittance of 43% for a wavelength of 430 nm and a transmittance of 90% or more for wavelengths of 460 nm and 550 nm, respectively. As the blue cut dye, two dyes having different maximum absorption wavelengths in the blue region, Eusorb UV-390 and Eusorb UV-1990 from Eutec Chemical Co., Ltd., were mixed and used.

OLED Panel

The circularly polarizing plate was attached to an OLED panel. As the OLED panel, a product from LGD, having an average reflectance of 40% for wavelengths in a range of 410 nm to 550 nm and an average reflectance of 48% for wavelengths in a range of 600 nm to 650 nm, was used.

Evaluation Example 1

Evaluation of Surface Reflection Characteristics in Antireflection Films

For antireflection films, reflectance colors and reflectance were measured to evaluate surface reflection characteristics. Table 1 shows results of measuring lowest reflection wavelengths, reflection colors (L*a*b* color coordinates) and reflectance in the antireflection films.

The reflectance of the antireflection film was measured by attaching a black tape absorbing light to the backside of the antireflective coating layer of the base material and then using Minolta's CM-2600d equipment to measure mirror reflectance of the surface layer of the antireflective coating layer. Specifically, the reflectance is a result value of subtracting the SCE (special component excluded) value from the SCI (special component included) value among the measured values of the equipment. Simultaneously with the above measurements, CIE 1976 L*a*b* under a D65 light source condition can be obtained from the measurement equipment. Since most of the SCE values were values reflected from the black tape attached to the backside instead of the antireflection film, the SCE values were subtracted to accurately determine the reflection characteristics of the antireflection film.

Table 1 shows L*a*b* color coordinates of reflection colors, luminous reflectance (Y) and reflectance for 550 nm in the antireflection films.

TABLE 1

| Antireflection film | Lowest reflection wavelength | Low refractive layer thickness | Reflection color (D65, CIE 1976 L*a*b*) | | | Reflectance |
|---|---|---|---|---|---|---|
| | | | L* | a* | b* | 550 nm |
| 1 | 400 nm | 76 nm | 9.66 | 2.16 | 5.91 | 1.1% |
| 2 | 420 nm | 80 nm | 8.96 | 2.49 | 5.40 | 1.0% |
| 3 | 440 nm | 84 nm | 8.25 | 2.84 | 4.57 | 0.9% |
| 4 | 460 nm | 88 nm | 7.57 | 3.15 | 3.40 | 0.8% |
| 5 | 480 nm | 92 nm | 6.98 | 3.32 | 1.91 | 0.7% |
| 6 | 500 nm | 96 nm | 6.50 | 3.42 | 0.08 | 0.7% |
| 7 | 520 nm | 99 nm | 6.18 | 3.48 | −2.11 | 0.6% |
| 8 | 540 nm | 103 nm | 6.05 | 3.46 | −4.66 | 0.6% |

Evaluation Example 2

Reflective Visual Appreciation Evaluation

For the OLED panels to which the circularly polarizing plates of Examples and Comparative Examples above were attached, reflective visual appreciation according to the configuration of the circularly polarizing plate was evaluated. At this time, the OLED panel was in a state of electric field off. Specifically, for the OLED panel to which the circularly polarizing plate was attached, L*a*b* color coordinates were measured. In a D65 light source environment, when a* is less than 8 and b* is more than −8.5 on the basis of the L*a*b* color coordinates, it can be evaluated that the reflective visual appreciation is excellent.

Here, the retardation value and optical axis of the retardation film are determined using Axometrics' Axoscan equipment, and the transmittance and absorption axis of the polarizer were determined using Jasco's V-7100 Spectrophotometer equipment.

The transmittance of the pressure-sensitive adhesive layer comprising the blue cut dye was measured using Shimadzu UV-3600. Specifically, it was measured using a sample that the pressure-sensitive adhesive comprising the blue cut dye was attached to a glass substrate, and then a transparent PET film was attached to the exposed pressure-sensitive adhesive surface again. Upon setting the baseline of the equipment before the measurement of the sample, it was performed in a state of loading a sample having the same structure as the measurement sample and introducing a transparent pressure-sensitive adhesive instead of the pressure-sensitive adhesive comprising the blue cut dye. As a result, the measured transmittance of the sample was measured under the condition that the reflectance was not included, whereby the transmittance of the wavelength band without absorption of the dye is 100%.

The reflectance of the antireflection film was measured by attaching a black tape absorbing light to the backside of the antireflective coating layer of the base material and then using Minolta's CM-2600d equipment to measure mirror reflectance of the surface layer of the antireflective coating layer. Specifically, the reflectance is a result value of subtracting the SCE (special component excluded) value from the SCI (special component included) value among the measured values of the equipment. Differences in the measured values were observed depending on the absorption axis direction of the polarizer upon the reflectance measurement, and thus it was measured under the condition that the length direction of the measuring instrument and the absorption axis direction of the polarizer were horizontal. Haze was measured using Murakami Color Research Laboratory's HM-150 equipment. L*a*b* color coordinates were measured by attaching the circularly polarizing plate to the OLED panel and measuring the reflectance and reflection colors of CIE 1964/10° standard under a D65 light source condition using Minolta's CM-2600d equipment. The reflective visual appreciation evaluation results were shown in Tables 1 to 6 and FIGS. 6 to 9. In Tables below, Y(D65) means luminous reflectance (%), and R@(550) means reflectance (%) of 550 nm. The transmittance of the circularly polarizing plate was measured using Jasco's V-7100 Spectrophotometer.

Evaluation Example 3

Reflective Visual Appreciation Evaluation According to Combination of Lowest Reflection Wavelength of Antireflection Film and Retardation of Retardation Film After attaching the circularly polarizing plates, in which the lowest reflection wavelengths of the antireflection films and the retardation of the retardation films were adjusted as in Tables 2 to 6, to the OLED panels, the reflection colors were evaluated in accordance with the above method, and the results were shown in Tables 2 to 6 and FIGS. 6 to 9 below. The transmittance of the circularly polarizing plates of Examples 1 to 12 and Comparative Examples 1 to 28 in Tables 2 to 6 for light having a wavelength of 430 nm is about 17%.

FIG. 4 illustratively shows a transmittance spectrum of a pressure-sensitive adhesive layer comprising a blue cut dye, in which the transmittance for light having a wavelength of 430 nm is 43%.

FIG. 5 illustratively shows reflectance spectra of an antireflection film having the lowest reflection wavelengths of 420 nm and 540 nm, respectively.

TABLE 2

|  |  | Lowest reflection wavelength of antireflection film (nm) | Retardation of retardation film (nm) | OLED panel reflection color (OLED off) | | | |
|---|---|---|---|---|---|---|---|
|  |  |  |  | Y (D65) | R@(550) (%) | a* (D65) | b* (D65) |
| Comparative Example | 1 | 400 | 130.0 | 1.61 | 1.35 | 9.12 | 4.55 |
|  | 2 | 420 | 130.0 | 1.52 | 1.26 | 9.58 | 4.21 |
|  | 3 | 440 | 130.0 | 1.44 | 1.17 | 10.03 | 3.62 |
|  | 4 | 460 | 130.0 | 1.36 | 1.09 | 10.48 | 2.76 |
|  | 5 | 480 | 130.0 | 1.30 | 1.01 | 10.89 | 1.59 |
|  | 6 | 500 | 130.0 | 1.24 | 0.95 | 11.22 | 0.12 |
|  | 7 | 520 | 130.0 | 1.21 | 0.91 | 11.45 | −1.60 |
|  | 8 | 540 | 130.0 | 1.19 | 0.88 | 11.52 | −3.52 |

TABLE 3

| | | Lowest reflection wavelength of antireflection film (nm) | Retardation of retardation film (nm) | OLED panel reflection color (OLED off) | | | |
|---|---|---|---|---|---|---|---|
| | | | | Y (D65) | R@(550) (%) | a* (D65) | b* (D65) |
| Comparative Example | 9 | 400 | 135.0 | 1.52 | 1.24 | 7.74 | −0.15 |
| | 10 | 420 | 135.0 | 1.44 | 1.15 | 8.17 | −0.61 |
| | 11 | 440 | 135.0 | 1.35 | 1.06 | 8.61 | −1.29 |
| | 12 | 460 | 135.0 | 1.28 | 0.97 | 9.04 | −2.19 |
| | 13 | 480 | 135.0 | 1.21 | 0.90 | 9.43 | −3.33 |
| | 14 | 500 | 135.0 | 1.61 | 0.84 | 9.76 | −4.71 |
| | 15 | 520 | 135.0 | 1.12 | 0.79 | 9.78 | −6.28 |
| | 16 | 540 | 135.0 | 1.11 | 0.77 | 10.04 | −7.98 |

TABLE 4

| | | Lowest reflection wavelength of antireflection film (nm) | Retardation of retardation film (nm) | OLED panel reflection color (OLED off) | | | |
|---|---|---|---|---|---|---|---|
| | | | | Y (D65) | R@(550) (%) | a* (D65) | b* (D65) |
| Example | 1 | 400 | 137.5 | 1.47 | 1.16 | 6.74 | −3.01 |
| | 2 | 420 | 137.5 | 1.38 | 1.07 | 7.16 | −3.54 |
| | 3 | 440 | 137.5 | 1.30 | 0.98 | 7.58 | −4.27 |
| | 4 | 460 | 137.5 | 1.22 | 0.90 | 7.99 | −5.20 |
| Comparative Example | 17 | 480 | 137.5 | 1.16 | 0.82 | 8.38 | −6.34 |
| | 18 | 500 | 137.5 | 1.10 | 0.76 | 8.69 | −7.67 |
| | 19 | 520 | 137.5 | 1.07 | 0.72 | 8.90 | −9.17 |
| | 20 | 540 | 137.5 | 1.05 | 0.69 | 8.96 | −10.76 |

TABLE 5

| | | Lowest reflection wavelength of antireflection film (nm) | Retardation of retardation film (nm) | OLED panel reflection color (OLED off) | | | |
|---|---|---|---|---|---|---|---|
| | | | | Y (D65) | R@(550) (%) | a* (D65) | b* (D65) |
| Example | 5 | 400 | 140.0 | 1.49 | 1.17 | 5.23 | −5.32 |
| | 6 | 420 | 140.0 | 1.41 | 1.08 | 5.59 | −5.88 |
| | 7 | 440 | 140.0 | 1.32 | 0.99 | 5.96 | −6.62 |
| | 8 | 460 | 140.0 | 1.25 | 0.91 | 6.31 | −7.53 |
| Comparative Example | 21 | 480 | 140.0 | 1.18 | 0.83 | 6.64 | −8.63 |
| | 22 | 500 | 140.0 | 1.13 | 0.77 | 6.91 | −9.90 |
| | 23 | 520 | 140.0 | 1.09 | 0.73 | 7.08 | −11.30 |
| | 24 | 540 | 140.0 | 1.08 | 0.70 | 7.13 | −12.77 |

TABLE 6

| | | Lowest reflection wavelength of antireflection film (nm) | Retardation of retardation film (nm) | OLED panel reflection color (OLED off) | | | |
|---|---|---|---|---|---|---|---|
| | | | | Y (D65) | R@(550) (%) | a* (D65) | b* (D65) |
| Example | 9 | 400 | 141.0 | 1.53 | 1.22 | 3.87 | −5.83 |
| | 10 | 420 | 141.0 | 1.44 | 1.13 | 4.17 | −6.39 |
| | 11 | 440 | 141.0 | 1.36 | 1.04 | 4.48 | −7.12 |
| | 12 | 460 | 141.0 | 1.29 | 0.96 | 4.78 | −8.02 |
| Comparative Example | 25 | 480 | 141.0 | 1.22 | 0.88 | 5.06 | −9.09 |
| | 26 | 500 | 141.0 | 1.17 | 0.82 | 5.28 | −10.32 |
| | 27 | 520 | 141.0 | 1.13 | 0.78 | 5.42 | −11.68 |
| | 28 | 540 | 141.0 | 1.12 | 0.75 | 5.45 | −13.11 |

Examples 13 to 20 and Comparative Examples 29 and 30

Circularly polarizing plates, in which the transmittance of the pressure-sensitive adhesive layer comprising the blue cut dye for a wavelength of 430 nm was adjusted as in Table 7 below, were prepared as Examples 13 to 20 and Comparative Examples 29 and 30. All of Examples 13 to 20 and Comparative Examples 29 and 30 are the same as Example 1, except that the lowest reflection wavelength of the anti-reflection film is 430 nm, the in-plane retardation value of the retardation film for a wavelength of 550 nm is 140.0 nm, and the angle formed by the slow axis of the retardation film and the absorption axis of the polarizer is 45 degrees. The circularly polarizing plates were attached to an OLED panel. The OLED panel was the same as that of Example 1. The transmittance of the pressure-sensitive adhesive layer decreases as the concentration of the blue cut dye increases. For example, the pressure-sensitive adhesive having transmittance of 43% for a wavelength of 430 nm is a sample in which as blue cut dyes, 0.3 wt % of Eusorb UV-390 and 4 wt % of Eusorb UV-1990 are added, relative to a pressure-sensitive adhesive having a thickness of 20 μm, the pressure-sensitive adhesive having transmittance of 10% for a wavelength of 430 nm is a sample produced by increasing the thickness of the pressure-sensitive adhesive comprising the dyes in the same content as the pressure-sensitive adhesive having transmittance of 43% by 2.7 times, and the pressure-sensitive adhesive having transmittance of 100% for a wavelength of 430 nm is a sample using a transparent pressure-sensitive adhesive without adding any blue cut dye relative to the pressure-sensitive adhesive having transmittance of 43%.

FIG. 14 shows results of measuring transmittance of the circularly polarizing plates of Comparative Example 30 and Example 17. The transmittance is transmittance measured on the circularly polarizing plate itself before attaching the circularly polarizing plate to the OLED panel. FIG. 14(a) and FIG. 14(b) are the same experimental results expressed differently only for the wavelength range of the x-axis (a: 400 to 500 nm, b: 400 to 700 nm). Example 17 exhibits transmittance of about 17.5% for a wavelength of 430 nm, where the transmittance for wavelengths of 460 nm and 550 nm is 40% or more. Comparative Example 30 exhibits transmittance of about 41% for a wavelength of 430 nm, where the transmittance for wavelengths of 460 nm and 550 nm is 40% or more.

Evaluation Example 4

Reflective Visual Appreciation Evaluation According to Transmittance of Pressure-Sensitive Adhesive Layer For the OLED panels to which the circularly polarizing plates of Examples 13 to 20 and Comparative Examples 29 and 30 were attached, the reflection colors were evaluated in the same manner as in Evaluation Example 1, and the results were shown in Table 7 and FIGS. 10 to 13 below. In Table 7 below, Oxy means, in the color coordinates of the white emission colors of the OLED panel, a value of the difference in x and y color coordinates between when the pressure-sensitive adhesive layer comprising the blue cut dye has been applied and when it has not been applied, which means that the larger the value, the color change of the light emitted at the time of driving the OLED panel is more severe.

TABLE 7

| | | Transmittance of blue cut pressure-sensitive adhesive layer (430 nm) | Transmittance of circularly polarizing plate (430 nm) | Emitting white transmissive color change (OLED on) Δxy | OLED panel reflection color (OLED off) | | | |
|---|---|---|---|---|---|---|---|---|
| | | | | | Y (D65) | R@(550) (%) | a* (D65) | b* (D65) |
| Example | 13 | 10% | 4% | 0.015 | 1.35 | 1.03 | 4.43 | −3.57 |
| | 14 | 16% | 7% | 0.012 | 1.35 | 1.03 | 4.75 | −4.25 |
| | 15 | 24% | 10% | 0.010 | 1.36 | 1.04 | 5.08 | −4.92 |
| | 16 | 33% | 13% | 0.008 | 1.36 | 1.04 | 5.43 | −5.57 |
| | 17 | 43% | 17% | 0.006 | 1.36 | 1.04 | 5.77 | −6.23 |
| | 18 | 52% | 21% | 0.005 | 1.37 | 1.04 | 6.15 | −6.89 |
| | 19 | 61% | 25% | 0.004 | 1.37 | 1.04 | 6.51 | −7.53 |
| | 20 | 69% | 28% | 0.003 | 1.37 | 1.04 | 6.87 | −8.12 |
| Comparative Example | 29 | 76% | 31% | 0.002 | 1.38 | 1.04 | 7.25 | −8.74 |
| | 30 | 100% | 41% | 0.000 | 1.39 | 1.04 | 9.46 | −12.01 |

EXPLANATION OF REFERENCE NUMERALS

10: antireflection film, 20: polarizer, 30: retardation film
40: pressure-sensitive adhesive layer

The invention claimed is:

1. A circularly polarizing plate comprising sequentially:
an antireflection film;
a polarizer;
a retardation film having an R(450)/R(550) value of 0.99 to 1.01 where R (λ) is an in-plane retardation value for a wavelength of λ nm; and
a pressure-sensitive adhesive layer,
wherein the antireflection film has a lowest reflection wavelength of 470 nm or less, the retardation film has an in-plane retardation value of 136.0 nm or more for a wavelength of 550 nm, and the circularly polarizing plate has a transmittance of 30% or less for a wavelength of 430 nm,
wherein in the antireflection film, reflection colors satisfy a L*a*b* color coordinate criteria of a*>0, b*>0 and a*<b*.

2. The circularly polarizing plate according to claim 1, wherein the lowest reflection wavelength of the antireflection film is 390 nm or more.

3. The circularly polarizing plate according to claim 1, wherein the antireflection film has a haze of 1% or less.

4. The circularly polarizing plate according to claim 1, wherein the polarizer has a transmittance for a wavelength of 550 nm in a range of 40% to 50%.

5. The circularly polarizing plate according to claim 1, wherein the in-plane retardation value of the retardation film for a wavelength of 550 nm is 143 nm or less.

6. The circularly polarizing plate according to claim 1, wherein a slow axis of the retardation film forms an angle of 43 degrees to 47 degrees with an absorption axis of the polarizer.

7. The circularly polarizing plate according to claim 1, wherein the retardation film is a liquid crystal polymerization film or a polymer stretched film.

8. The circularly polarizing plate according to claim 1, wherein the circularly polarizing plate has a transmittance of 40% or more for wavelengths of 460 nm and 550 nm.

9. The circularly polarizing plate according to claim 1, wherein the circularly polarizing plate has a transmittance of 4% or more for a wavelength of 430 nm.

10. The circularly polarizing plate according to claim 1, wherein the circularly polarizing plate further comprises a dye exhibiting a maximum absorbance for a wavelength in a range of 370 nm to 430 nm.

11. An OLED (organic light emitting diode) device comprising an OLED panel and the circularly polarizing plate of claim 1 disposed on one side of the OLED panel.

12. The OLED device according to claim 11, wherein the OLED panel has an average reflectance of 45% or less for a wavelength in a range of 410 nm to 500 nm and an average reflectance of 50% or less for a wavelength in a range of 600 nm to 650 nm.

13. The OLED device according to claim 11, wherein the OLED panel, to which the circularly polarizing plate is attached, has a reflectance of 1.3% or less for a wavelength of 550 nm.

14. The OLED device according to claim 11, wherein reflection colors of the OLED panel, to which the circularly polarizing plate is attached, satisfy a L*a*b* color coordinate criteria of a*<8 and b*>−8.5.

* * * * *